United States Patent
Capitaneanu et al.

(10) Patent No.: US 8,019,562 B2
(45) Date of Patent: Sep. 13, 2011

(54) METHOD FOR DETECTING THE LOSS OF ONE OR MORE PHASES IN A PERMANENT-MAGNET SYNCHRONOUS ELECTRIC MOTOR

(75) Inventors: Stefan Capitaneanu, Mousseaux Neuville (FR); Fabrice Jadot, Pacy sur Eure (FR); Ludovic Kermarrec, Evreux (FR); Francois Malrait, Jouy sur Eure (FR)

(73) Assignee: Schneider Toshiba Inverter Europe SAS, Pacy sur Eure (FR)

( * ) Notice: Subject to any disclaimer, the term of this patent is extended or adjusted under 35 U.S.C. 154(b) by 596 days.

(21) Appl. No.: 12/120,707

(22) Filed: May 15, 2008

(65) Prior Publication Data
US 2008/0294360 A1    Nov. 27, 2008

(30) Foreign Application Priority Data
May 25, 2007   (FR) .................................... 07 55258

(51) Int. Cl.
*G01R 31/34*   (2006.01)

(52) U.S. Cl. ........................................... 702/65

(58) Field of Classification Search .............. 702/65
See application file for complete search history.

(56) References Cited

U.S. PATENT DOCUMENTS

| | | | |
|---|---|---|---|
| 4,833,628 A * | 5/1989 | Curran, Jr. ................. | 318/800 |
| 5,677,606 A | 10/1997 | Otake | |
| 6,459,999 B1 | 10/2002 | Krietemeier et al. | |
| 6,611,771 B1 | 8/2003 | Habetler et al. | |
| 2006/0186914 A1 * | 8/2006 | Ho ............................. | 324/772 |

* cited by examiner

*Primary Examiner* — Tung S Lau
(74) *Attorney, Agent, or Firm* — Oblon, Spivak, McClelland, Maier & Neustadt, L.L.P.

(57) ABSTRACT

A method implemented in a speed controller to detect a loss of one phase, two phases or three phases in a three-phase permanent-magnet synchronous motor, running or stopped at rest, said controller executing a control in closed loop operation, said method including: determining, with the speed controller, a reference flux current as a function of a reference torque current, said reference torque current being calculated from a reference speed applied to the motor and a measurement of the speed or the position carried out on the motor; applying, with the speed controller, the reference flux current and injecting currents over various phases of the motor; and measuring, with the speed controller, the currents over at least two phases and determining the loss of one phase, of two phases or of three phases from these measured currents.

10 Claims, 2 Drawing Sheets

Figure 1:
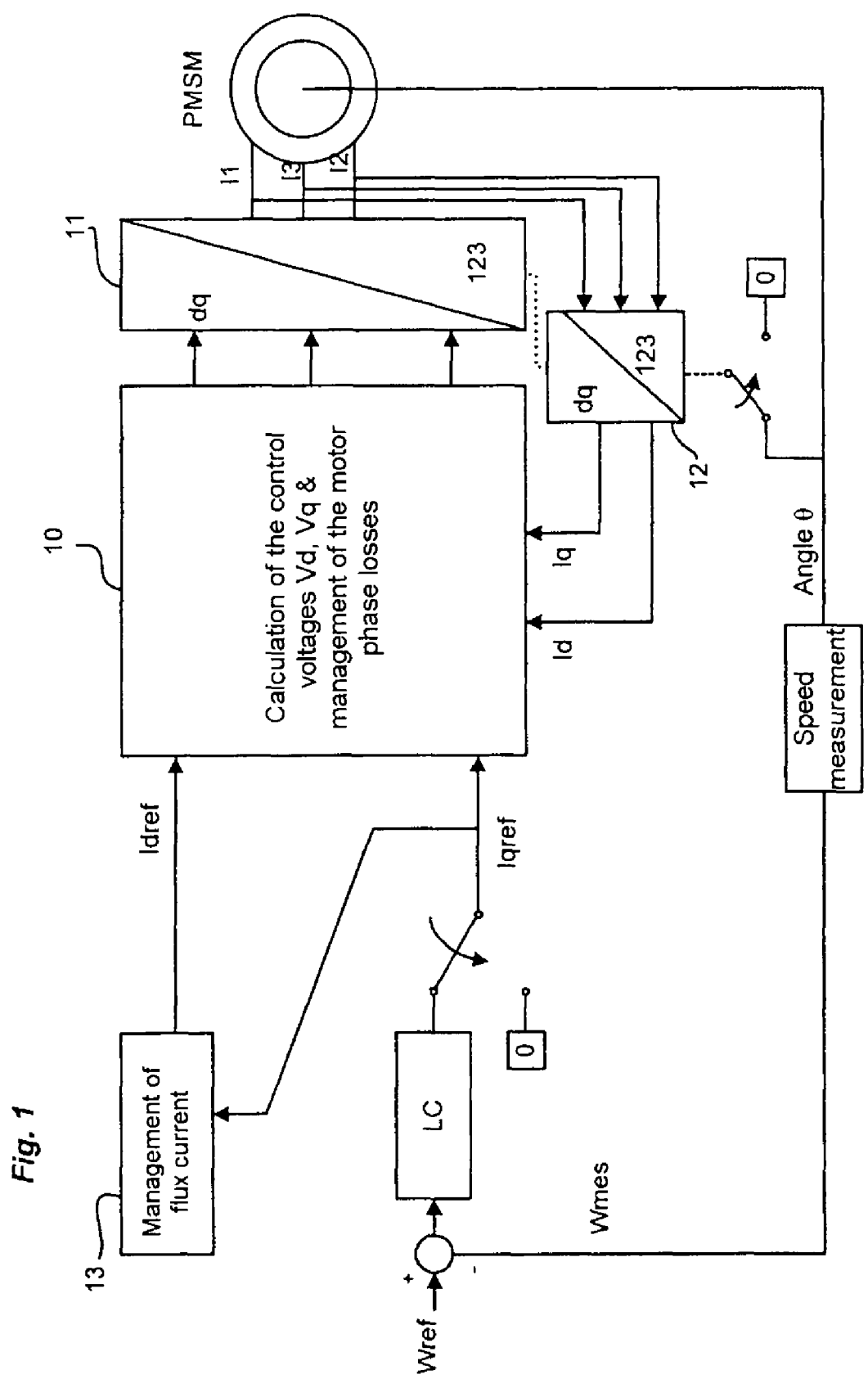

METHOD FOR DETECTING THE LOSS OF ONE OR MORE PHASES IN A PERMANENT-MAGNET SYNCHRONOUS ELECTRIC MOTOR

The present invention relates to a method implemented in a speed controller to detect a loss of one phase, two phases, or three phases in a permanent-magnet synchronous electric motor. This method is implemented in a closed loop, i.e. with measurement of the speed or position in the motor. The invention also relates to a speed controller capable of implementing the method defined above.

In a system comprising an electric motor and a speed controller, the loss of one or more phases is an unpredictable phenomenon. It may appear in the course of operation or on stopping and may be due, for example, to the loosening of screws through vibration, to a cut cable, to an omitted connection or to a non-controlled connection. The loss of one or more phases may cause significant damage and it is therefore important to be able to identify automatically the loss of one or more phases in the motor.

U.S. Pat. No. 7,161,375 describes a method for detecting phase loss in a permanent magnet motor in open loop operation. This method only works when the motor is initially at rest and consists in injecting a torque current into the motor windings, in measuring a current in one phase of the motor, in comparing the current value determined with a calculated value and in deciding from the phase loss whether the difference between the measured current and the calculated current is higher than a predetermined value. The solution envisaged in this patent does not allow detection of the loss of all the phases at the same time. In addition, it is implemented during the phase of starting the motor after having positioned the stopped motor in a determined position.

The aim of the invention is to propose a method for detecting the loss of one or more phases of the motor while this is running or at rest and without affecting the torque control, i.e. without generating additional oscillations or torque loss.

This aim is attained by a method implemented in a speed controller to detect a loss of one phase, two phases or three phases in a three-phase permanent-magnet synchronous motor, running or stopped at rest, said controller executing a control in closed loop operation, said method being characterized in that it comprises steps of:
  determining a reference flux current as a function of a reference torque current, said reference torque current being calculated from a reference speed to be applied to the motor and a measurement of the speed or the position carried out on the motor;
  applying the reference flux current with a view to injecting currents over the various phases of the motor; and
  measuring the currents over at least two phases and determining the loss of one phase, of two phases or of three phases from these measured currents.

According to a particular feature, the loss of one phase, of two phases or of three phases is determined after a predefined duration.

According to another particular feature, the reference flux current is applied according to a control ramp less than the predefined duration.

According to another particular feature, if no reference torque current is applied, a minimum reference flux current is applied in order to be able to detect phase loss in the motor.

According to another particular feature, the reference flux current is incremented up to a final value according to a control ramp as long as the reference torque current is less than said final value.

According to another particular feature, the reference flux current is decremented down to zero according to a control ramp from the moment the reference torque current is greater than a determined value.

According to the invention, to detect the loss of three phases when the motor is running, the method also comprises steps of:
  determining the modulus of the rms current of the currents injected over the three phases;
  comparing the modulus of the rms current determined with a predetermined value; and
  determining the loss of three phases of the running motor when the modulus of the rms current has remained less than the predetermined value for a predefined duration.

In order to detect the loss of one or more phases when the motor is stopped at rest, the method comprises steps of:
  determining the modulus of the rms voltage to apply to the motor;
  comparing the modulus of the rms voltage with a predetermined value; and
  determining the loss of one or more phases of the motor stopped at rest when the modulus of the rms voltage has remained above the predetermined value for a predefined duration.

When the motor is stopped at rest, it comprises a step of determining a flux current from the currents injected over each phase and a step of applying this flux current with a predefined angle.

In order to detect the loss of a phase when the motor is running, the method comprises steps of:
  obtaining the rotating reference angle of the control;
  comparing the modulus of the rms current applied over each phase with a predetermined value;
  depending on the comparison, assigning or not assigning the rotating reference angle to each of the angles of the injected currents over the different phases of the motor; and
  studying the variation in each of the angles over the course of time and determining the loss of a phase of the running motor depending on this study.

The invention also relates to a speed controller able to implement a control in closed loop operation to control a permanent-magnet synchronous electric motor, said controller being able to implement the method defined above.

The main idea of the invention is therefore to apply a current in the direction of flow without affecting the torque control, i.e. without generating additional oscillations or torque loss.

The motor is stopped at rest, with brake applied, in applications such as in lifts or in lifting. In this case, it is important to know that the motor is well connected before releasing the brake, because otherwise a loss of load is possible. The detection of the loss of one or more phases of the motor must therefore be implemented in the controller before starting the acceleration ramp.

Figure 2:
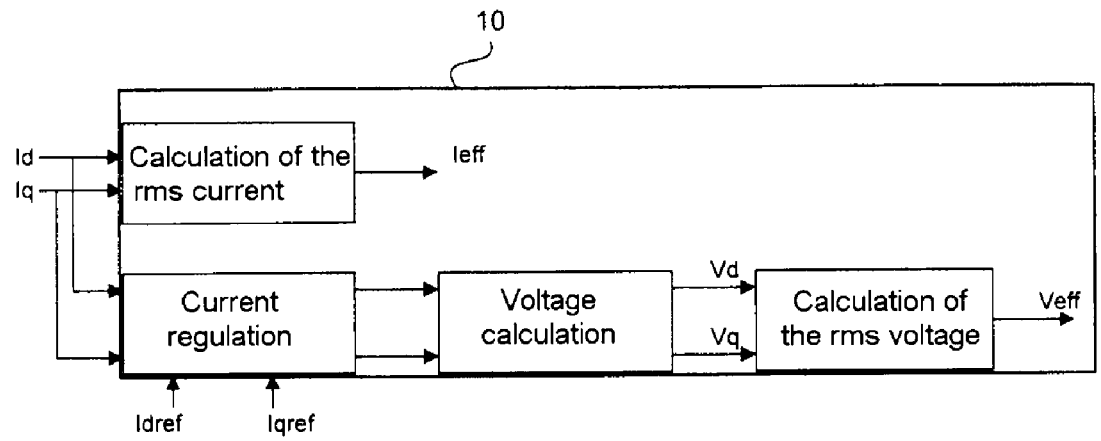
Figure 3:
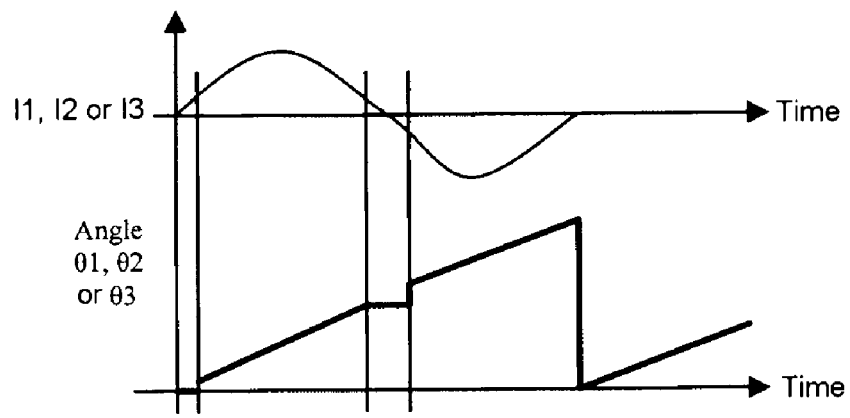

Other features and advantages will appear in the detailed description that follows, referring to an embodiment given by way of example and represented by the appended drawings in which:

FIG. 1 shows the overview diagram of the control implemented in the speed controller to control the permanent-magnet synchronous motor; and FIGS. 2 and 3 illustrate the criteria implemented to detect the loss of one or more phases in the motor.

The invention consists in detecting the loss of one or more phases in a permanent-magnet synchronous electric motor PMSM which is running or at rest. It is implemented in a speed controller implementing a control in closed loop operation, i.e. with detection of the speed or the position realized in the motor PMSM.

With reference to FIG. 1, in the control implemented in a speed controller 1 for a permanent-magnet synchronous electric motor PMSM it is known to send a reference speed Wref, to determine a reference torque current Iqref based on the speed control law LC employed and from the return of the speed measurement Wmes, for example from a calculation based on a return of the position when in closed loop operation. The reference torque current Iqref thus determined is sent to a control unit 10 allowing determination of the control voltages Vq and Vd. These control voltages Vd, Vq are applied in a control unit 11 converting them, for example by Park's transformation, into control currents I1, I2, I3 to be applied to the three phases of the permanent magnet motor PMSM.

The invention consists in injecting into the motor control a reference flux current Idref, the value of which depends on the reference torque current Iqref determined. This reference flux current Idref is thus applied in the direction of the permanent flux of the magnet of the motor PMSM, i.e. along the axis d of the control, called the flux axis. It must only be applied when the torque current is not sufficient for identification of the loss of motor phases. The flux current Idref is thus applied according to a determined control ramp until a final value $IdOPF_{cont}$ is attained. As long as the reference torque current Iqref is less than this final value $IdOPF_{cont}$, the reference flux current is incremented according to its control ramp until attaining its final value $IdOPF_{cont}$. The reference flux current Idref remains at this value $IdOPF_{cont}$ if the reference torque current Iqref has not exceeded the value of $IdOPF_{cont}$. The value of $IdOPF_{cont}$ is, for example, 10% of the rated current of the motor PMSM. This value may be adjusted depending on the power of the speed controller used. Conversely, as long as the reference torque current Iqref is greater than the value $IdOPF_{cont}$, the reference flux current Idref is decremented according to the same control ramp until its value is zero. In FIG. 1, the management of the reference flux current Idref is carried out in the control unit 13 of the overview diagram.

The control ramp of the reference flux current is chosen to be less than the duration of the phase-loss detection sequence. According to the case, the control ramp is, for example, 100 milliseconds or 20 milliseconds. The predefined duration of the detection sequence is, for example, 500 milliseconds.

According to the invention, the application of a current in the direction of flux of the magnet avoids disturbances being created in the motor when it is running. In fact, the injection of a flux current does not create oscillations with an additional torque because the current is applied according to ramps that are long in relation to the system dynamics but short in relation to the time for detecting the defect. Moreover, there is no torque loss because the reference flux current Idref is only applied when the reference torque current Iqref is low.

According to the invention, in order to detect the loss of one phase, of two phases or of three phases when the motor is running or stopped at rest, the speed controller implements various steps taking account of various criteria determined by the speed controller.

The determination of the loss of one or more phases is carried out thanks to measurement of the currents I1, I2, I3 injected over the three motor phases. It is also possible to measure the currents over two phases alone and to reconstitute the third current.

The currents I1, I2, I3 obtained are processed and converted in a control unit 12 so as to obtain a current from component d and a current from component q. The two currents Id and Iq thus determined are applied in the control unit 10 with a view to participating in the determination of the control voltages Vd, Vq as a function of the reference torque current Iqref and the reference flux current Idref.

In order to detect the loss of three phases when the motor is running, the following condition is applied. If the modulus of the rms current Irms, equal to $\sqrt{Id^2+Iq^2}$, applied over the three motor phases remains less than a limiting value $IdOPF_{diag}$ of the reference flux current Idref for a predefined duration, for example 500 milliseconds, the defect of the loss of three phases is identified.

A timer may be used to carry out this function. The counter increments itself each time the condition is fulfilled and decrements itself when the condition is not fulfilled. When the timer has reached the predefined duration, this means that none of the three motor phases is connected to the speed controller.

According to the invention, $IdOPF_{diag}$ may be equal to $IdOPF_{cont}$, but for more robust detection $IdOPF_{diag}$ is chosen to be greater than $IdOPF_{cont}$, for example with $IdOPF_{diag}=1.5 \times IdOPF_{cont}$.

When the motor is stopped at rest, i.e. with the brake applied, the condition for determining the loss of three phases is different. In this case, it is a matter of comparing the modulus of the rms voltage Vrms to be applied to the motor with a predefined limiting value, hereafter designated UOPF, equal for example to 37.5% of the voltage provided at the DC bus of the speed controller. In a manner known per se, the modulus of the rms voltage Vrms is equal to $\sqrt{Vd^2+Vq^2}$; the torque voltage Vq and the flux voltage Vd being determined on the basis of the currents Idref, Iqref and the currents Id, Iq coming from the current measurements I1, I2, I3 (FIG. 2). In this way, if the modulus of the rms voltage Vrms applied to the motor is larger than the limiting value UOPF, this means that none of the three phases of the motor PMSM is connected to the speed controller 1.

In order to determine the loss of one phase or of two phases, the criteria for determination are different, given that a current is always flowing in the motor even if one phase is missing.

When the motor PMSM is running, the detection of the loss of one phase is effected by studying the variation in the angles of the measured currents.

For each phase, if the modulus of the current measured over each phase I1, I2 or I3 is greater than a value $IOPF_{123}$, the angle θ1, θ2, θ3 of each of the currents assumes the measured value of the rotating reference angle θ of the control. The angle θ is recovered by known methods from the speed or position measurement carried out on the motor (FIG. 1). Conversely, if the modulus of the current measured over each of these phases is less than the value $IOPF_{123}$, the angle θ1, θ2, θ3 of each of the currents preserves its previous value, which is the last corresponding value where the modulus of the measured current over each phase was greater than the value $IOPF_{123}$. $IOPF_{123}$ may be a predefined value, a function of the rated current of the motor, or, for more robustness, may vary as a function of the rms current (Irms) calculated from the measured currents I1, I2, I3. In the latter case, $IOPF_{123}$ is, for example, equal to the rms current Irms divided by four.

Then it is a matter of studying the variation in the course of time of each of the angles θ1, θ2, θ3 in relation to θ. If the angles θ1, θ2, θ3 vary little or not at all in relation to θ for a predefined duration, for example 500 milliseconds, then the phase loss may be identified over the phase 1, over the phase 2, or over the phase 3. As previously, a timer may be used for each phase. This timer is incremented or decremented if the condition is fulfilled or not fulfilled.

In summary:

If $|I_{123}|>|IOPF_{123}|$ then the angle θ1, θ2 or θ3 is equal to θ;
if $|I_{123}|\leq|IOPF_{123}|$ then the angle θ1, θ2 or θ3 preserves its previous value; and
if |θ1−θ| or |θ2−θ| or |θ3−θ|>θmin for a predefined duration, for example 500 milliseconds, the loss of phase 1, phase 2, or phase 3 is identified. θmin is chosen, for example, to be equal to p/2.

FIG. 3 shows the variation in an angle θ1, θ2 or θ3 as a function of the corresponding measured sinusoidal current I1, I2 or I3. In this FIG. 3, it is noticeable that when the current is low, the corresponding value of the angle θ1, θ2 or θ3 remains constant.

When the motor is stopped at rest, brake applied, and when one or two phases are not correctly connected, the control voltages Vd, Vq rapidly attain inadmissible levels. Hence, as for the detection of the loss of three phases when the motor is running, the modulus of the rms voltage Vrms becomes greater than a predetermined value UOPF. If this condition is fulfilled for a predefined duration, for example 500 milliseconds, it is possible to conclude the loss of a phase from this. In this situation, as the injected currents are sinusoidal, it is necessary to be sure of not obtaining a zero current over a phase when it is not zero and concluding a phase loss when this is not the case. According to the invention, the flux current Id which is injected into the control unit 10 is therefore oriented according to a predefined angle, for example of value zero, for which a current is sure to be obtained if the three phases were correctly connected. The angle is kept at this value during the implementation of the detection method.

As the brake is applied, the dynamics of the reference flux current do not affect the torque dynamics. Due to this fact, the reference flux current Idref may attain the current level IdOPF$_{cont}$ according to a shorter control ramp than when the motor is running, for example 20 milliseconds. It is also possible to give IdOPF$_{cont}$ a higher value, for example around the rated current of the motor.

It is understood that other variants and improvements in detail may be imagined, and even the use of equivalent means envisaged, without departing from the scope of the invention.

The invention claimed is:

1. A method implemented in a speed controller to detect a loss of one phase, two phases or three phases in a three-phase permanent-magnet synchronous motor, running or stopped at rest, said controller executing a control in closed loop operation, said method comprising:
   determining, with the speed controller, a reference flux current as a function of a reference torque current, said reference torque current being calculated from a reference speed applied to the motor and a measurement of the speed or the position carried out on the motor;
   applying, with the speed controller, the reference flux current to inject currents over various phases of the motor wherein the reference flux current is decremented according to a control ramp until its value is zero; and
   measuring, with the speed controller, the currents over at least two phases and determining the loss of one phase, of two phases or of three phases from these measured currents.

2. The method according to claim 1, wherein the loss of one phase, of two phases or of three phases is determined after a predefined duration.

3. The method according to claim 2, wherein the reference flux current is applied according to the control ramp that is less than the predefined duration.

4. The method according to claim 1, wherein the reference flux current is decremented down to zero according to the control ramp from a moment the reference torque current is greater than a determined value.

5. The method according to claim 1, further comprising:
   determining a modulus of a rms current of the currents injected over the three phases;
   comparing the modulus of the rms current determined with a predetermined value; and
   determining the loss of three phases of the running motor when the modulus of the rms current has remained less than a predetermined value for a predefined duration.

6. The method according to claim 1, further comprising:
   determining a modulus of a rms voltage to apply to the motor;
   comparing the modulus of the rms voltage with a predetermined value; and
   determining the loss of one or more phases of the motor stopped at rest when the modulus of the rms voltage has remained above the predetermined value for a predefined duration.

7. The method according to claim 1, further comprising:
   obtaining a rotating reference angle (θ);
   comparing a modulus of an rms current applied over each phase with a predetermined value;
   depending on the comparing, assigning or not assigning the rotating reference angle to each angles of the injected currents over the phases of the motor; and
   studying a variation in each of the angles over time and determining the loss of a phase of the running motor depending on this study.

8. The method according to one of claims 1 to 3, wherein if no reference torque current is applied, a minimum reference flux current is applied in order to be able to detect phase loss.

9. The method according to claim 6, wherein when the motor is stopped at rest, the method further comprises determining the flux current from the currents injected over each phase and the applying includes applying the flux current with a predefined angle.

10. A speed controller to detect a loss of one phase, two phases or three phases in a three-phase permanent-magnet synchronous motor, running or stopped at rest, said speed controller comprising:
   a control unit configured to determine a reference flux current as a function of a reference torque current, said reference torque current being calculated from a reference speed applied to the motor and a measurement of the speed or the position carried out on the motor, to apply the reference flux current to inject currents over various phases of the motor, wherein the reference flux current is decremented according to a control ramp until its value is zero to measure the currents over at least two phases, and to determine the loss of one phase, of two phases or of three phases from these measured currents.

* * * * *